(12) United States Patent
Yudasaka

(10) Patent No.: US 6,359,606 B1
(45) Date of Patent: Mar. 19, 2002

(54) ACTIVE MATRIX DISPLAY (75) Inventor: Ichio Yudasaka, Chimo (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/297,278

(22) PCT Filed: Aug. 25, 1998

(86) PCT No.: PCT/JP98/03758

§ 371 Date: Jul. 1, 1999

§ 102(e) Date: Jul. 1, 1999

(87) PCT Pub. No.: WO99/12394

PCT Pub. Date: Mar. 11, 1999

(30) Foreign Application Priority Data

Aug. 29, 1997 (JP) .............................................. 9-234921

(51) Int. Cl.⁷ ................................................. G09G 3/36
(52) U.S. Cl. .............................. 345/87; 345/76; 345/92; 345/93; 345/206; 313/483; 313/498; 313/500; 313/502; 313/503; 313/504; 313/506; 313/512; 313/499; 315/169.1; 315/169.3
(58) Field of Search ............................ 345/87, 88, 206, 345/89, 45, 46, 38, 39, 47, 48, 92, 91; 315/169.1–169.3; 313/483, 498, 500, 502, 503, 504, 506, 512, 499

(56) References Cited

U.S. PATENT DOCUMENTS 5,317,432 A * 5/1994 Ino .............................. 359/59
5,414,547 A * 5/1995 Matsuo et al. ................. 359/67
5,550,066 A   8/1996 Tang et al.
6,091,382 A * 7/2000 Shioya et al. .................. 345/76
5,989,945 A * 9/2000 Yudasaka et al. ............ 438/149
6,115,014 A * 9/2000 Aoki et al. ..................... 345/88
6,188,176 B1 * 2/2001 Nakaya et al. .............. 313/500
6,194,837 B1 * 2/2001 Ozawa ........................ 313/566

FOREIGN PATENT DOCUMENTS

| JP | A-60-202682 | 10/1985 |
| JP | A-4-212287 | 8/1992 |
| JP | A 5-182759 | 7/1993 |
| JP | A-7-111341 | 4/1995 |
| JP | A 7-282975 | 10/1995 |
| JP | A-7-312290 | 11/1995 |
| JP | A-8-111285 | 4/1996 |
| JP | A-8-227276 | 9/1996 |

* cited by examiner

Primary Examiner—Richard Hjerpe
Assistant Examiner—Ali Zamani
(74) Attorney, Agent, or Firm—Oliff & Berridge, PLC (57) ABSTRACT In an active matrix display device, each pixel is provided with a pixel electrode, an organic semiconductor film deposited on the upper layer side of the pixel electrode, and a thin film luminescent element provided with an opposing electrode formed on the upper layer side of the organic semiconductor film. A protective film covering almost the entire surface of a substrate is formed on the upper layer of the opposing electrode. The protective film prevents the entry of moisture or oxygen to inhibit the deterioration of the thin film luminescent element.

17 Claims, 6 Drawing Sheets

ACTIVE MATRIX DISPLAY

BACKGROUND OF THE INVENTION

1. Field of the Invention

The present invention relates to an active matrix display device wherein the drive of a thin film luminescent element such as an electroluminescent element (hereinafter referred to as an "EL element") or a light emitting diode element (hereinafter referred to as an "LED element"), which emits light when drive current passes through a luminescent thin film such as an organic semiconductor film, is controlled by a thin film transistor (hereinafter referred to as a "TFT").

2. Description of Related Art

An active matrix display device has been proposed which employs a current-controlled luminescent element such as an EL element or an LED element. All these luminescent elements are self-luminescent, making them advantageous in that they do not need a backlight that is required in the case of a liquid crystal display device and that they depend less on viewing angles.

Figure 4:
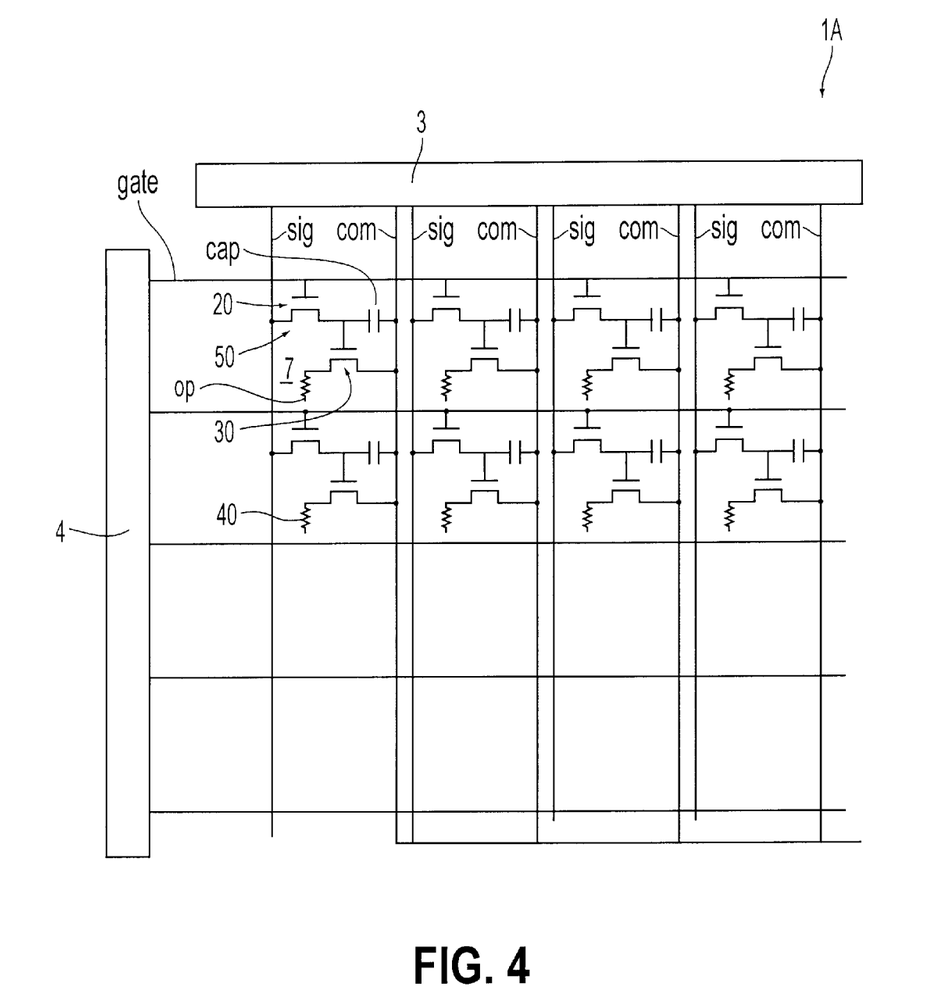
FIG. 4 is a block diagram schematically showing the entire layout of a conventional active matrix display device.

FIG. 4 is a block diagram of an active matrix display device employing an EL element that emits light by means of a charge-injection type organic semiconductor thin film. Disposed on a transparent substrate 10 of an active matrix display device 1A are a plurality of scanning lines gate, a plurality of data lines sig extendedly provided in such a direction that they intersect with the direction in which the scanning lines gate are extendedly provided, a plurality of common feeder lines com parallel to the data lines sig, and pixels 7 formed in a matrix by the data lines sig and the scanning lines gate. A data side drive circuit 3 and a scanning side drive circuit 4 are configured for the data lines sig and the scanning lines gate. Provided for each pixel 7 are a conduction control circuit 50 to which scanning signals are supplied via the scanning lines gate, and a thin film luminescent element 40 that emits light in accordance with image signals supplied from the data lines sig via the conduction control circuit 50. The conduction control circuit 50 is constituted by a first TFT 20 in which scanning signals are supplied to a gate electrode thereof via the scanning lines gate, a retention capacitor cap that retains image signals supplied from the data lines sig via the first TFT 20, and a second TFT 30 in which the image signals retained by the retention capacitor cap are supplied to a gate electrode thereof. The second TFT 30 and the thin film luminescent element 40 are connected in series between an opposing electrode op and the common feeder lines com to be discussed hereinafter. When the second TFT 30 is placed in an ON state, drive current passes through the common feeder lines com, causing the thin film luminescent element 40 to emit light, and the luminescent state is retained by the retention capacitor cap for a predetermined period of time.

Figure 5:
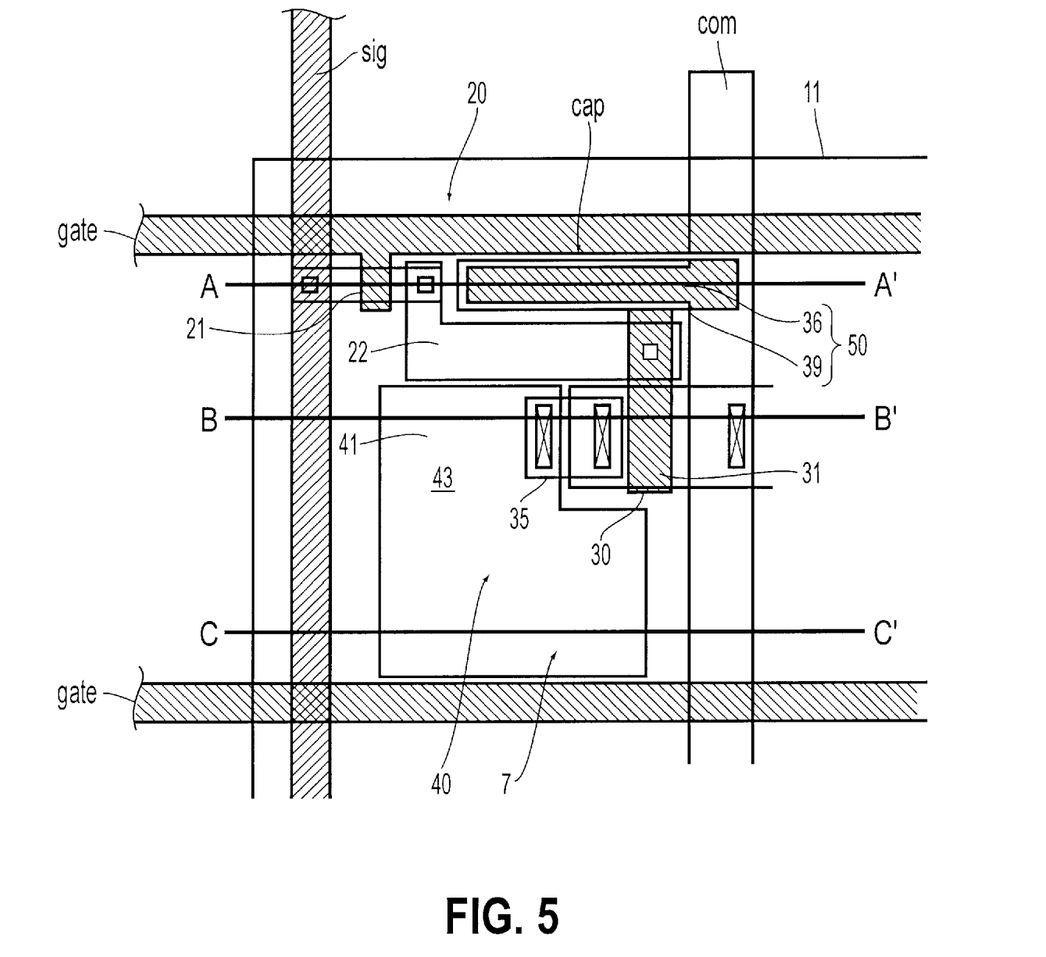
FIG. 5 is a top plan view of one of the pixels included in the active matrix display device shown in FIG. 4.
Figure 6A:
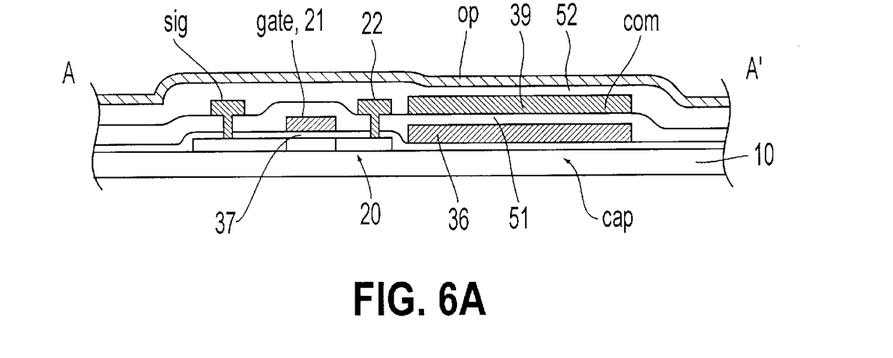

FIG. 5 is a top plan view showing one of the pixels included in the active matrix display device shown in FIG. 4. FIGS. 6(A), (B), and (C) are a sectional view taken at the line A–A', a sectional view taken at the line B–B', and a sectional view taken at the line C–C' of FIG. 5, respectively.

Figure 6B:
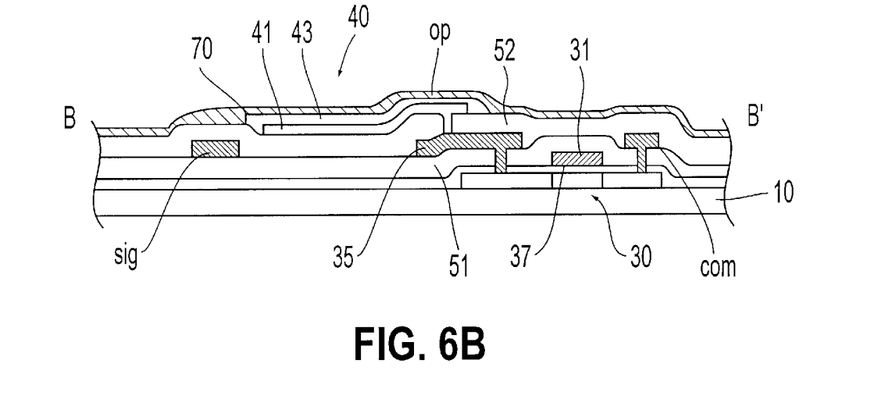

In the active matrix display device 1A having such a configuration, the first TFT 20 and the second TFT 30 are formed in the same process by utilizing island-like semiconductor films in every pixel 7 as shown in FIG. 5 and FIG. 6(A) and (B). The first TFT 20 has a gate electrode 21 configured as a part of the scanning line gate. In the first TFT 20, the data line sig is electrically connected via a contact hole of a first interlayer insulating film 51 to one end of a source and drain region, while a drain electrode 22 is electrically connected to the other end thereof. The drain electrode 22 is extendedly provided toward the region where the second TFT 30 is formed. A gate electrode 31 of the second TFT 30 is electrically connected to the extendedly provided portion via a contact hole of the first interlayer insulating film 51. A relay electrode 35 is electrically connected to one end of the source and drain region of the second TFT 30 via the contact hole of the first interlayer insulating film 51. A pixel electrode 41 of the thin film luminescent element 40 is electrically connected to the relay electrode 35 via a contact hole of a second interlayer insulating film 52.

Figure 6C:
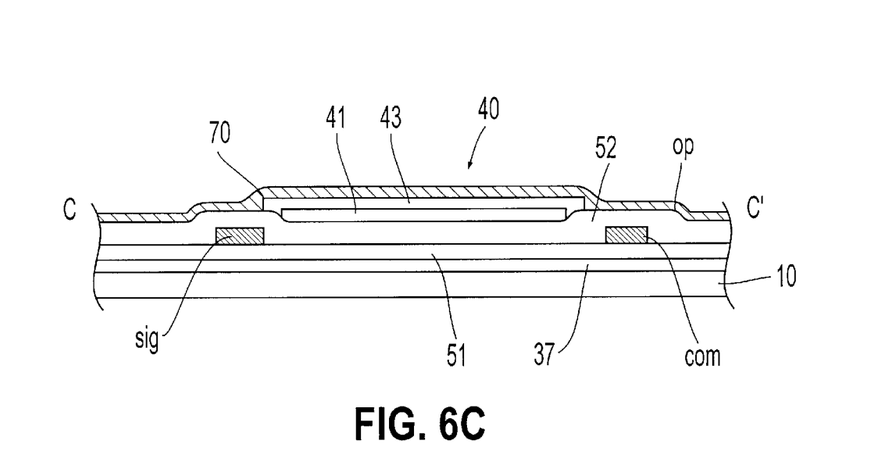

As can be seen from FIG. 5 and FIGS. 6(B) and (C), the pixel electrode 41 is formed independently for each pixel 7. On the upper layer side of the pixel electrode 41, an organic semiconductor film 43 and the opposing electrode op are laminated in this order. The opposing electrode op is formed so that it covers at least a display section 11.

Referring back to FIG. 5 and FIG. 6(A), the common feeder line com is electrically connected to the other end of the source and drain region of the second TFT 30 via the contact hole of the first interlayer insulating film 51. An extendedly provided portion 39 of the common feeder line com opposes an extendedly provided portion 36 of the gate electrode 31 of the second TFT 30, with the first interlayer insulating film 51 sandwiched therebetween as a dielectric film thereby to form the retention capacitor cap.

The active matrix display device 1A provides a great advantage in that the opposing electrode op deposited on the transparent substrate 10 obviates the need for laminating an opposing substrate, differentiating itself from an active matrix liquid crystal display device. However, the thin film luminescent element 40 is simply covered by the thin opposing electrode op, so that moisture or oxygen intrudes into the organic semiconductor film 43 by diffusing and transmitting through the opposing electrode op, leading to a danger of deteriorated luminous efficiency, a higher drive voltage (shift of a threshold voltage to a higher voltage side), and deteriorated reliability of the thin film luminescent element 40. To prevent the entry of the moisture or oxygen, the conventional active matrix display device 1A has been employing a method wherein at least the display section 11 is covered by an opposing substrate, and the outer periphery of the opposing substrate has been sealed. This method, however, inevitably sacrifices the advantage over the liquid crystal display device.

SUMMARY OF THE INVENTION

Accordingly, an object of the present invention is to provide an active matrix display device capable of protecting a thin film luminescent element from moisture, etc. by means of a simple structure.

The active matrix display device in accordance with the present invention has the following configuration.

The active matrix display device has a display section on a substrate, the display section being formed by a plurality of scanning lines, a plurality of data lines intersecting the scanning lines, and a plurality of pixels formed in a matrix by the data lines and the scanning lines, each of the pixels having a conduction control circuit including a thin film transistor to which a scanning signal is supplied to a gate electrode thereof via the scanning lines, a pixel electrode formed for each pixel, a luminescent thin film deposited on an upper layer side of the pixel electrode, and a thin film luminescent element equipped with an opposing electrode which is formed at least on an entire surface of the display section on an upper layer side of the luminescent thin film, and the thin film luminescent element emitting light in accordance with image signals supplied from the data lines via the conduction control circuit, wherein: a protective film is formed on the upper layer side of the opposing electrode, which covers at least a region where the opposing electrode is formed.

According to the configuration, the thin film luminescent element can be protected against moisture, etc., that is diffused or transmitted through the opposing electrode since the protective film is formed on the upper layer side of the opposing electrode of the thin film luminescent element. Hence, it is possible to prevent deteriorated luminous efficiency, a rise in the drive voltage (the shift of a threshold voltage to the higher voltage side), deteriorated reliability, etc. in the thin film luminescent element. Moreover, the protective film can be easily formed by using a semiconductor process, so that it does not add to the manufacturing cost of the active matrix display device. Thus, the reliability of the active matrix display device can be improved, while retaining the advantage of the active matrix display device employing the thin film luminescent element in which no opposing substrate is required to be deposited. Furthermore, since the protective film protects the thin film luminescent element, the material used for the opposing electrode may be selected from the viewpoint mainly of the luminous efficiency or the drive voltage of the thin film luminescent element, thus providing another advantage in that the material is not limited to one having high performance to protect the thin film luminescent element.

In the present invention, it is preferable that the luminescent thin film is partitioned by an insulating film formed on a lower layer side of the opposing electrode so that it is thicker than the organic semiconductor film. In the active matrix display device employing the thin film luminescent element, the opposing electrode is formed at least over the entire surface of the display section and opposes the data line; therefore, a large parasitic capacitor is produced on the data line as is. According to the present invention, however, the presence of the thick insulating film between the data line and the opposing electrode makes it possible to inhibit the parasitic capacitor from being produced on the data line. As a result, the load on a data side drive circuit can be reduced, enabling reduced power consumption or quicker display operation. In addition, the insulating film formed as mentioned above can be used as a bank layer for preventing a discharge liquid from spilling out when forming a luminescent thin film in a region partitioned by the insulating film by the ink-jet process.

In the present invention, preferably, the opposing electrode is formed of, for example, an aluminum film containing an alkali metal. When the opposing electrode is formed of such a film, the possibility of moisture, etc. being diffused or transmitted is higher; hence, the effect of the formation of the protective film is remarkable.

In the present invention, the protective film may be formed of an insulating film such as a silicon nitride film, or it may be formed of a conductive film of a metal having a high melting point or an alloy thereof. Further, alternatively, the protective film may be formed of a conductive film such as a pure aluminum film, an aluminum film containing silicon, or an aluminum film containing copper. Further, the protective film may be formed of two layers consisting of a conductive film and an insulating film. When the protective film deposited on the opposing electrode is formed of a conductive film, the same effect that can be obtained from lowering the electrical resistance of the opposing electrode can be achieved. When the thick insulating film is formed partitioning the region where the organic semiconductor film is formed, the large difference in level produced by the insulating film may cause disconnection of the opposing electrode formed on the upper layer side thereof. Forming the protective film deposited on the opposing electrode of a conductive film makes it possible to prevent the disconnection of the opposing electrode because the conductive film forms a redundant wiring structure. Accordingly, even when the thick insulating film is formed around the organic semiconductor film to suppress a parasitic capacitance in an active matrix display device, the disconnection of the opposing electrode formed on the upper layer of the insulating film does not occur, enabling improved display quality and reliability of the active matrix display device to be achieved.

In the present invention, the conduction control circuit is preferably provided with the first TFT wherein the scanning signals are supplied to the gate electrode thereof, and the second TFT wherein the gate electrode thereof is connected to the data lines via the first TFT, and the second TFT and the thin film luminescent element are connected in series between the common feeder line for supplying drive current, which is configured separately from the data lines and the scanning lines, and the opposing electrode. In other words, the conduction control circuit could be constructed by one TFT and a retention capacitor; however, it is preferable to configure the conduction control circuit of each pixel by two TFTs and a retention capacitor to accomplish higher display quality.

BRIEF DESCRIPTION OF THE DRAWINGS

FIGS. 3 (A), (B), and (C) are a sectional view taken at the line A–A', a sectional view taken at the line B–B', and a sectional view taken at the line C–C', respectively, of FIG. 2.

FIGS. 6 (A), (B), and (C) are a sectional view taken at the line A–A', a sectional view taken at the line B–B', and a sectional view taken at the line C–C', respectively, of FIG. 5.

DETAILED DESCRIPTION OF PREFERED EMBODIMENTS

An embodiment of the present invention will be described with reference to the accompanying drawings. In the following description, the same reference numerals will be assigned to the components common to the elements described with reference to FIG. 4 to FIG. 6.

(Entire Configuration)

Figure 1:
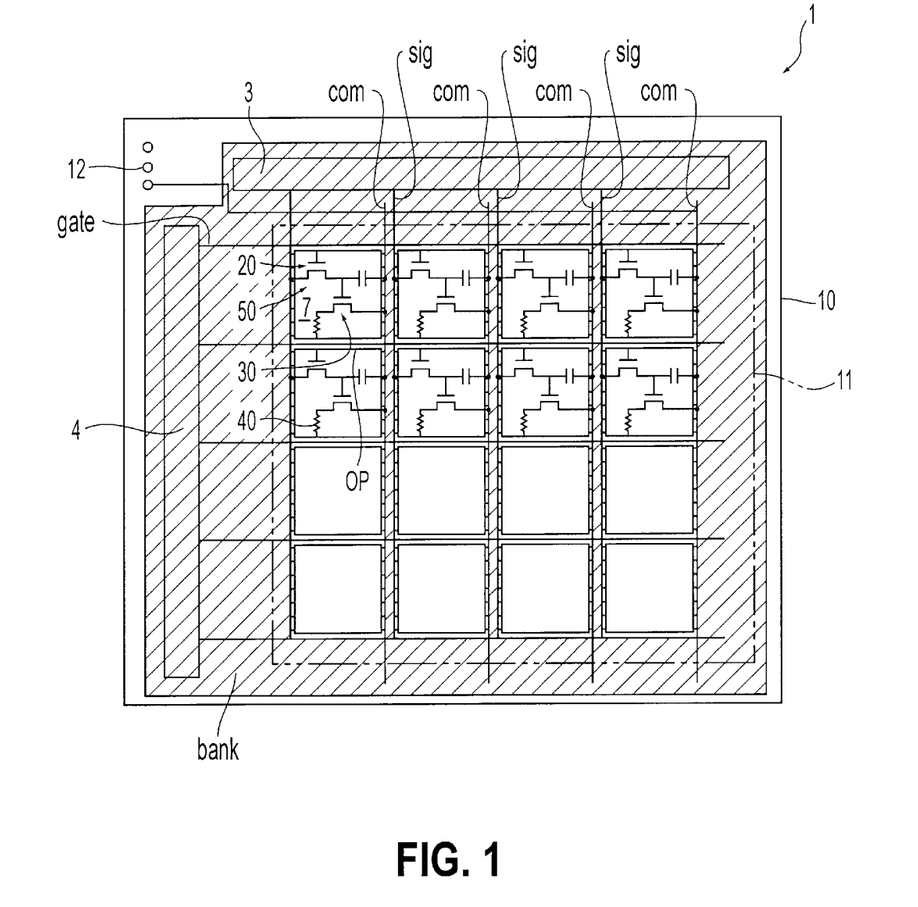
FIG. 1 is a block diagram schematically showing an entire layout of an active matrix display device to which the present invention has been applied.
Figure 2:
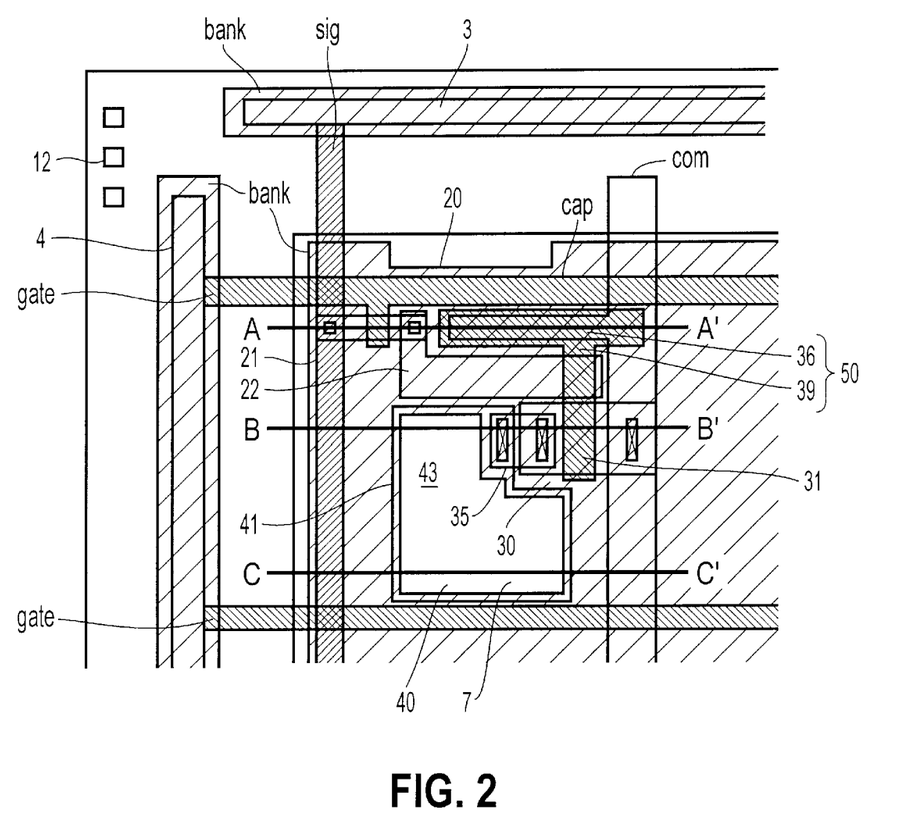
FIG. 2 is a top plan view of one of the pixels included in the active matrix display device shown in FIG. 1.

FIG. 1 is a block diagram schematically showing the entire layout of an active matrix display device; FIG. 2 is a top plan view of one of the pixels included therein; and FIGS. 3 (A), (B), and (C) are a sectional view taken at the line A–A', a sectional view taken at the line B–B', and a sectional view taken at the line C–C', respectively, of FIG. 2.

In an active matrix display device 1 shown in FIG. 1, the central portion of a transparent substrate 10, which is the base of the apparatus, provides a display section 11. In the outer peripheral portion of the transparent substrate 10, a data side drive circuit 3 that outputs image signals is formed at the ends of data lines sig, and a scanning side drive circuit 4 that outputs scanning signals is formed at the ends of scanning lines gate. In these drive circuits 3 and 4, complementary TFTs are formed by N-type TFTs and P-type TFTs, the complementary TFTs constituting a shift register circuit, a level shifter circuit, an analog switching circuit, etc. As in the active matrix substrate of an active matrix liquid crystal display device, the display section 11 has, on the transparent substrate 10, a plurality of pixels 7 formed in a matrix by the plurality of scanning lines gate and the plurality of data lines sig extendedly provided in a direction intersecting with the direction in which the scanning lines gate are extendedly provided.

Each of the pixels 7 includes a conduction control circuit 50 to which scanning signals are supplied via the scanning lines gate, and a thin film luminescent element 40 that emits light in accordance with image signals supplied from the data lines sig via the conduction control circuit 50. The example shown herein is formed by a first TFT 20 wherein scanning signals are supplied to a gate electrode thereof via the scanning lines gate, a retention capacitor cap that retains image signals supplied from the data lines sig via the first TFT 20, and a second TFT 30 in which the image signals retained by the retention capacitor cap are supplied to the gate electrode thereof. The second TFT 30 and the thin film luminescent element 40 are connected in series between an opposing electrode op and the common feeder lines corn to be discussed in detail hereinafter.

Figure 3A:
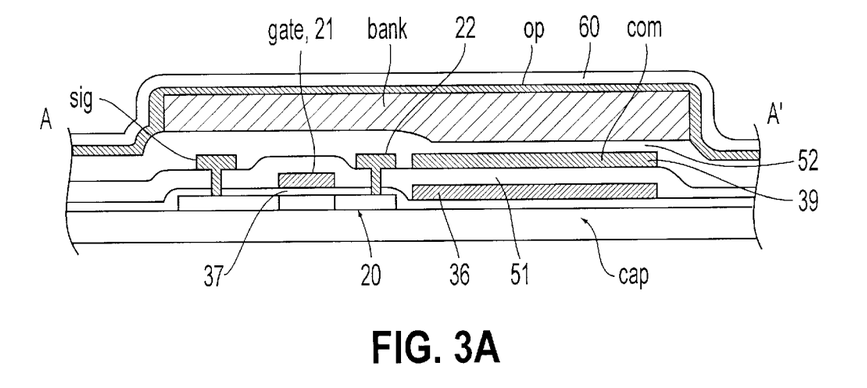
Figure 3B:
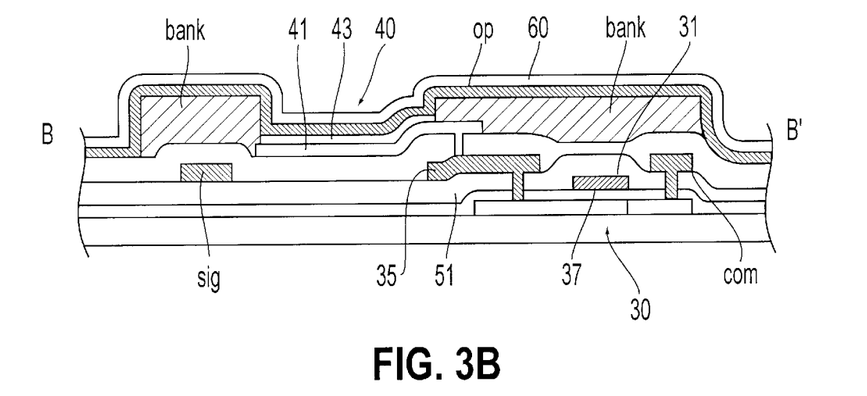

In the active matrix display device 1 having such a configuration, the first TFT 20 and the second TFT 30 are formed by utilizing island-like semiconductor films (silicon films) in every pixel 7 as shown in FIG. 2 and FIGS. 3(A) and (B).

The first TFT 20 has a gate electrode 21 configured as a part of the scanning line gate. In the first TFT 20, the data line sig is electrically connected via a contact hole of a first interlayer insulating film 51 to one end of a source and drain region, while a drain electrode 22 is. electrically connected to the other end thereof. The drain electrode 22 is extendedly provided toward the region where the second TFT 30 is formed. A gate electrode 31 of the second TFT 30 is electrically connected to the extendedly provided portion via a contact hole of the first interlayer insulating film 51.

A relay electrode 35 that is formed at the same time as the data lines sig is electrically connected to one end of the source and drain region of the second TFT 30 via the contact hole of the first interlayer insulating film 51. A transparent pixel electrode 41 formed of an ITO film of the thin film luminescent element 40 is electrically connected to the relay electrode 35 via a contact hole of a second interlayer insulating film 52.

Figure 3C:
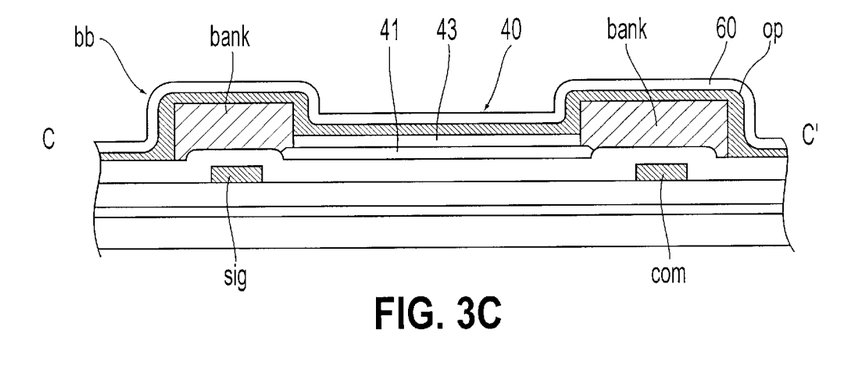

As can be seen from FIG. 2 and FIGS. 3(B) and (C), the pixel electrode 41 is formed independently for each pixel 7. On the upper layer side of the pixel electrode 41, an organic semiconductor film 43 formed of polyphenylene vinylene (PPV) or the like and the opposing electrode op formed of a metal film composed of aluminum and calcium containing an alkali metal such as lithium are laminated in this order to constitute the thin film luminescent element 40. The organic semiconductor film 43 is formed for each pixel 7; however, it may be formed in stripes over a plurality of pixels 7 in some cases. The opposing electrode op is formed over the entire display section 11 and the region except at least the peripheral area of the portion wherein terminals 12 are formed.

The thin film luminescent element 40 may have a structure that enhances the luminous efficiency (hole injection efficiency) by providing a hole injection layer, a structure that enhances the luminous efficiency (electron injection efficiency) by providing an electron injection layer, or a structure wherein both the hole injection layer and the electron injection layer are formed.

Referring back to FIG. 2 and FIG. 3(A), the common feeder line com is electrically connected to the other end of the source and drain region of the second TFT 30 via the contact hole of the first interlayer insulating film 51. An extendedly provided portion 39 of the common feeder line com opposes an extendedly provided portion 36 of the gate electrode 31 of the second TFT 30, with the first interlayer insulating film 51 sandwiched therebetween as a dielectric film thereby to form the retention capacitor cap.

In the active matrix display device 1 configured as discussed above, when the first TFT 20 is selected by a scanning signal and placed in an ON state, the image signal from a data line sig is applied to the gate electrode 31 of the second TFT 30 via the first TFT 20, and the image signal is written to the retention capacitor cap via the first TFT 20. As a result, when the second TFT 30 is placed in the ON state, a voltage is applied with the opposing electrode op and the pixel electrode 41 serving as the negative pole and the positive pole, respectively. In an area where the applied voltage exceeds a threshold voltage, the current (drive current) passing through the organic semiconductor film 43 suddenly increases. Hence, the luminescent element 40 emits light as an electroluminescent element or an LED element, and the light from the luminescent element 40 is reflected by the opposing electrode op and transmitted through the transparent pixel electrode 41 and the transparent substrate 10 before it goes out. The drive current for emitting the light goes through a current path constructed by the opposing electrode op, the organic semiconductor film 43, the pixel electrode 41, the second TFT 30, and the common feeder lines com. Therefore, when the second TFT 30 is placed in an OFF state, the current no longer passes through. However, even when the first TFT 20 is placed in the OFF state, the gate electrode of the second TFT 30 is retained at a potential equivalent to the image signal by the retention capacitor cap, thus holding the second TFT 30 in the ON state. Accordingly, the drive current continues to pass through the luminescent element 40, and the pixel is held ON. This state is maintained until new image data is written to the retention capacitor cap and the second TFT 30 is placed in the OFF state.

(Protective Structure of Thin Film Luminescent Element)

Thus, the active matrix display device 1 employing the thin film luminescent element 40 provides a great advantage in that the opposing electrode op deposited on the transparent substrate 10 itself obviates the need of laminating an opposing substrate, differentiating itself from an active matrix liquid crystal display device. However, there is a danger in that moisture or oxygen intrudes into the thin film luminescent element 40 by diffusion and transmission through the thin opposing electrode op. Particularly in this embodiment, an aluminum film containing an alkali metal such as lithium is employed for the opposing electrode op in order to enhance the electron injection efficiency in the thin film luminescent element 40, so as to lower the drive voltage, whereas the aluminum film containing an alkali metal is considered to permit diffusion and transmission of moisture or oxygen more easily than pure aluminum does. More specifically, the aluminum film containing an alkali metal exhibits lower toughness than a pure aluminum film, an aluminum film containing silicon, or an aluminum film containing copper, so that it is apt to break when subjected to stress, leading to a possibility of the entry of moisture or oxygen through a crack or the like. Further, a fracture surface of an aluminum film containing an alkali metal shows a columnar texture, and it is conceivable that moisture or oxygen is easily diffused and transmitted through the texture.

For the reason described above, a protective film 60 composed of pure aluminum is formed on the upper layer of the opposing electrode op. The protective film 60 formed of pure aluminum has a toughness that is sufficiently high to survive stress to a certain extent, so that it inhibits the occurrence of a crack that leads to a path for the entry of moisture or oxygen. Further, the fracture surface of pure aluminum does not exhibit a columnar texture observed in the aluminum film containing an alkali metal, eliminating the possibility of entry of moisture or oxygen through the texture. Hence, the active matrix display device 1 of this embodiment is capable of protecting the thin film luminescent element 40 from moisture, etc., thus inhibiting deterioration in the luminous efficiency, an increase in the drive voltage (the shift of the threshold voltage to the higher voltage side), deterioration in reliability, etc. of the thin film luminescent element 40. Moreover, the Or protective film 60 formed of the pure aluminum film can be easily formed by utilizing a semiconductor process; therefore, it does not add to the manufacturing cost of the active matrix display device 1. This makes it possible to improve the reliability of the active matrix display device 1 while retaining the advantage of the active matrix display device 1 employing the thin film luminescent element 40 in which there is no need to deposit an opposing substrate.

In addition, since the protective film 60 protects the thin film luminescent element 40, the material used for the opposing electrode op may be selected from the viewpoint mainly of the luminous efficiency or the drive voltage of the thin film luminescent element 40, thus providing another advantage in that the material is not limited to one having high performance to protect the thin film luminescent element 40.

Furthermore, in this embodiment, the protective film 60 deposited on the opposing electrode op is formed of a conductive film composed of the pure aluminum film, so that the same advantages obtained by lowering the electrical resistance of the opposing electrode op can be achieved.

(Structure of Bank Layer)

In the active matrix display device 1 configured as described above, in order to protect the data lines sig from a large parasitic capacitor, the embodiment is provided with a thick insulating film (a bank layer bank/the hatched area) formed of a resist film or a polyimide film along the data lines sig and the scanning lines gate as shown in FIG. 1, FIG. 2, and FIGS. 3 (A), (B), and (C), and the opposing electrode op is formed on the upper layer side of the bank layer bank. Hence, the presence of a second interlayer insulating film 52 and the thick bank layer bank between the data lines sig and the opposing electrode op controls the capacitance parasitic to the data lines sig to an extremely small value. This makes it possible to reduce the load on the drive circuits 3 and 4 and to achieve reduced power consumption and quicker display operation.

Further, as shown in FIG. 1, the bank layer bank (the hatched formation area) is formed also in a peripheral area of the transparent substrate 10 (area outside the display section 11). Accordingly, both the data side drive circuit 3 and the scanning side drive circuit 4 are covered by the bank layer bank. The opposing electrode op is formed at least in the display section 11, and it is not required to be formed in the area wherein the drive circuits are formed. However, the opposing electrode op is normally formed by mask sputtering, and poor alignment accuracy causes the opposing electrode op to be superimposed on the drive circuits in some cases. Even if the opposing electrode op should overlap the area wherein the drive circuits are formed as mentioned above, the presence of the bank layer bank between the wiring layers of the drive circuits and the opposing electrode op prevents the capacitor from being parasitic to the drive circuits 3 and 4. This makes it possible to reduce the load on the drive circuits 3 and 4 and to achieve reduced power consumption and quicker display operation.

Further in this embodiment, the bank layer bank is also formed in the area overlapping the relay electrode 35 of the conduction control circuit 50 in an area of the region where the pixel electrode 41 is formed. Therefore, the organic semiconductor film 43 is not formed in the area overlapping the relay electrode 35. This means that the organic semiconductor film 43 is formed only in a flat area of the region where the pixel electrode 41 is formed, so that the organic semiconductor film 43 is produced to have a constant thickness, thus preventing nonuniform display. If the bank layer bank is absent in the area overlapping the relay electrode 35, the drive current passes between the relay electrode 35 and the opposing electrode op in the area, and the organic semiconductor film 43 emits light. The light, however, does not go out because it is held between the relay electrode 35 and the opposing electrode op and therefore does not contribute to display. The drive current that has passed through the area that does not contribute to display may be considered as invalid current from the viewpoint of display. In this embodiment, however, the bank layer bank is formed in the area, wherein such-an invalid current used to pass through, so as to prevent the drive current from passing therethrough. This makes it possible to prevent wasteful current from passing through the common feeder lines con; hence, the width of the common feeder lines con can be made smaller accordingly. As a result, the luminescent area can be increased, enabling improved display performance including luminance and contrast ratio to be achieved.

When the thick bank layer bank is formed, there is a danger in that a large step bb formed by the bank layer bank shown in FIGS. 3(A)–3(C) causes the disconnection of the opposing electrode op formed on the upper layer side. In this embodiment, however, the protective film 60 deposited on the opposing electrode op is formed of a conductive film, and a redundant wiring structure is configured by the conductive film (the protective film 60). Therefore, even when the thick bank layer bank is formed to suppress a parasitic capacitor or the like, the opposing electrode op formed on the upper layer of the bank layer bank will not incur disconnection, thus permitting improved display quality and reliability of the active matrix display device 1.

If the bank layer bank is formed using a black resist, then the bank layer bank functions as a black matrix, which improves display quality including contrast ratio. In other words, in the active matrix display device 1 according to the embodiment, the opposing electrode op is formed on the entire surface of the pixels 7 on the surface side of the transparent substrate 10, and the light reflected by the opposing electrode op deteriorates the contrast ratio. Using the black resist for the bank layer bank, which serves to prevent the parasitic capacitor, causes the bank layer bank to function as the black matrix and blocks the light reflected from the opposing electrode op, thus leading to a higher contrast ratio.

(Manufacturing Method of Active Matrix Display Device)

The bank layer bank formed as described above surrounds the region wherein the organic semiconductor film 43 is formed; therefore, it dams up a discharge liquid to prevent it from protruding sideways when the organic semiconductor film 43 is produced using a liquid material discharged from an ink-jet head (a discharged liquid) in the manufacturing process of the active matrix display device. In the manufacturing method of the active matrix display device 1 to be described below, the steps for forming the first TFT 20 and the second TFT 30 on the transparent substrate 10 are nearly the same as those for manufacturing an active matrix substrate of the liquid crystal active matrix display device 1. Hence, the outline of the process will be briefly explained with reference to FIGS. 3 (A), (B), and (C).

First, a foundation protective film (not shown) composed of a silicon oxide film that is about 2000 to about 5000 angstroms thick is formed on the transparent substrate 10 by the plasma CVD technique using TEOS (tetraethylorthosilicate) or oxygen gas as the material gas as necessary. Then, a semiconductor film composed of an amorphous silicon film having a thickness of about 300 to about 700 angstroms is formed on the surface of the foundation protective film by the plasma CVD technique. Subsequently, the semiconductor film formed of the amorphous silicon film is subjected to a crystallizing process such as laser annealing or solid phase growth technique to crystallize the semiconductor film into a polysilicon film.

Next, the semiconductor film is patterned into an island-like semiconductor film, and a gate insulating film 37 composed of a silicon oxide film or nitride film having a thickness of about 600 to about 1500 angstroms is formed on the surface of the island-like semiconductor film by the plasma CVD technique using TEOS (tetraethylorthosilicate) or oxygen gas as the material gas.

Subsequently, a conductive film that is formed of a metal film composed of aluminum, tantalum, molybdenum, titanium, or tungsten is formed by the sputtering technique, then patterning is carried out to form gate electrodes 21 and 31, and the extendedly provided portion 36 of the gate electrode 31 (a gate electrode forming step). In this step, the scanning lines gate are also formed.

In this state, high concentration phosphorus ions are implanted to produce the source and drain regions in a self-alignment fashion with respect to the gate electrodes 21 and 31. A portion where no impurity has been introduced provides a channel region.

Next, after the first interlayer insulating film 51 is formed, the respective contact holes are formed, and the data line sig, the drain electrode 22, the common feeder line com, the extendedly provided portion 39 of the common feeder line com, and the relay electrode 35 are formed. As a result, the first TFT 20, the second TFT 30, and the retention capacitor cap are formed.

Then, the second interlayer insulating film 52 is formed, and a contact hole is formed in a portion of the interlayer insulating film that corresponds to the relay electrode 35. After an ITO film is formed on the entire surface of the second interlayer insulating film 52, patterning is carried out to form the pixel electrode 41 for each pixel 7, the pixel electrode 41 being electrically connected to the source and drain regions of the second TFT 30 via the contact hole.

In the following step, a resist layer is formed on the surface of the second interlayer insulating film 52, then it is patterned so that the resist is left along the scanning line gate and the data line sig to form the bank layer bank. At this time, the resist portion to be left along the data line sig should be wide enough to cover the common feeder line corn. As a result, the region wherein the organic semiconductor film 43 of the luminescent element 40 is surrounded by the bank layer bank. Then, the organic semiconductor films 43 corresponding to R, G, and B, respectively, are formed in the region defined in a matrix by the bank layer bank by using the ink-jet process. For this purpose, a liquid material (precursor) for making the organic semiconductor film 43 is discharged from an ink-jet head to the region inside the bank layer bank, and the discharged liquid material is fixed in the region inside the bank layer bank to form the organic semiconductor film 43. The bank layer bank is formed of a resist, so that it is water-repellent, whereas the precursor of the organic semiconductor film 43 employs a hydrophilic solvent. Hence, the applied region of the organic semiconductor film 43 is securely partitioned by the bank layer bank and does not protrude to the adjacent pixel 7. This enables the organic semiconductor film 43 to be formed only in a predetermined region. In this step, the precursor discharged from the ink-jet head expands to have a thickness of about 2 $\mu$m to about 4 $\mu$m due to surface tension; therefore, the bank layer bank is required to have a thickness of about 1 $\mu$m to about 3 $\mu$m. The thickness of the organic semiconductor film 43 after it has been fixed ranges from about 0.05 $\mu$m to about 0.2 $\mu$m. If the partition formed of the bank layer bank has a height of 1 $\mu$m or more from the beginning, then the bank layer bank will satisfactorily function as a partition even if the bank layer bank is not water-repellent. Forming the thick bank layer bank beforehand makes it possible to define the region wherein the organic semiconductor film 43 is to be formed when forming the organic semiconductor film 43, by an applying process in place of the ink-jet process.

After that, the opposing electrode op is formed on nearly the entire surface of the transparent substrate 10, and the protective film 60 is deposited on the upper layer of the opposing electrode op. The protective film 60 will securely provide sufficient resistance to humidity if it has a thickness of about 2000 angstroms to about 1 $\mu$m.

According to the manufacturing method, the respective organic semiconductor films 43 corresponding to R, G, and B can be formed in predetermined regions by using the ink-jet process, permitting the manufacture of the active matrix display device 1 of a full-color feature with higher productivity.

The TFTs are formed also in the data side drive circuit 3 and the scanning side drive circuit 4 shown in FIG. 1. These TFTs are formed using all or some of the steps for forming the TFTs in the pixels 7. This means that the TFTs constituting the drive circuits are formed between the same layers as the TFTs of the pixels 7. Regarding the first TFT 20 and the second TFT 30, both may be of the N-type or P-type, or one of them may be the N-type while the other may be the P-type. Regardless of the combinations of the N-type and the P-type, the TFTs can be formed by a well-known process; therefore, the description thereof will be omitted.

[Other Embodiments]

The protective film 60 may be produced in the same manner as that in the embodiment described above by using other metal film formed of an aluminum film containing silicon or an aluminum film containing copper or other metal besides the pure aluminum film as long as it is a conductive film that transmits less moisture or oxygen. Further, the protective film 60 may employ a metal having a high melting point or an alloy or the like thereof. Furthermore, using an insulating film such as a silicon nitride film as the protective film 60 permits the inhibition of deterioration in the thin film luminescent element 40. In addition, the protective film 60 may be of a double-layer structure consisting of an insulating film and a conductive film. In this case, depositing the conductive film on the opposing electrode op permits the implementation of the foregoing redundant wiring structure. In any case, the protective film is able to secure satisfactory resistance to humidity as long as it has a thickness of about 2000 angstroms to about 1 μm.

When a resist film or a polyimide film formed of an organic material is used for the bank layer bank (insulating film), a thick film can be easily formed. When the bank layer bank (insulating film) is formed of a silicon oxide film or a silicon nitride film made of an inorganic material and formed by using the CVD process or the SOG process, the deterioration of the organic semiconductor film 43 can be inhibited even if the bank layer bank is in contact with the organic semiconductor film 43.

Further, besides the configuration in which the retention capacitor cap is formed in relation to the common feeder line con, the retention capacitor cap may be configured so that it is formed in relation to a capacitive line provided in parallel to the scanning line gate, or it may be configured by using the drain region of the first TFT 20 and the gate electrode 31 of the second TFT 30.

As described above, the active matrix display device has a protective film formed on the upper layer side of an opposing electrode of a thin film luminescent element, enabling the thin film luminescent element to be protected against moisture, etc. Hence, there is no possibility of deterioration of the thin film luminescent element. Moreover, the protective film can be easily formed by utilizing a semiconductor process, so that it does not add to the manufacturing cost of the active matrix display device. Therefore, the reliability of the active matrix display device can be improved, while retaining the advantage of the active matrix display device employing the thin film luminescent element in which no opposing substrate is required to be deposited. Furthermore, since the protective film protects the thin film luminescent element, the material used for the opposing electrode may be selected from the viewpoint mainly of the luminous efficiency or the drive voltage of the thin film luminescent element, thus providing another advantage in that the material is not limited to one having high performance to protect the thin film luminescent element.

Industrial Applicability

Having the advantages described above, the present invention is ideally used as an active matrix display device in which the drive of a thin film luminescent element such as an electroluminescent element or a light emitting diode element is controlled by thin film transistors. Furthermore, an active matrix display device to which the present invention has been applied can be extensively used not only for a personal computer, a portable information terminal but also for information display equipment including an outdoor large bulletin board and an advertisement signboard.

What is claimed is:

1. An active matrix display device comprising:
   a substrate;
   a display section on the substrate, the display section comprising a plurality of scanning lines, a plurality of data lines intersecting the scanning lines, and a plurality of pixels formed in a matrix by the data lines and the scanning lines, each of the pixels comprising:
   a circuit including a thin film transistor having a gate electrode to which a scanning signal is supplied via the scanning lines,
   a pixel electrode,
   a luminescent thin film on the pixel electrode, and
   a thin film luminescent element comprising the pixel electrode, the luminescent thin film and an opposing electrode, the opposing electrode being in common with a plurality of pixel electrodes, the thin film luminescent element emitting light in accordance with image signals supplied from the data lines via the circuit; and
   a protective film disposed on the opposing electrode that covers at least a region where the opposing electrode is formed.

2. The active matrix display device according to claim 1, further comprising an insulating film disposed below the opposing electrode, the insulating film being formed to be thicker than the luminescent thin film, the insulating film defining an area of the luminescent thin film.

3. The active matrix display device according to claim 1, the opposing electrode comprising an aluminum film containing an alkali metal.

4. The active matrix display device according to claim 1, the protective film comprising an insulating film.

5. The active matrix display device according to claim 3, the protective film comprising an insulating film.

6. The active matrix display device according to claim 1, the protective film comprising a silicon nitride film.

7. The active matrix display device according to claim 3, the protective film comprising a silicon nitride film.

8. The active matrix display device according to claim 1, the protective film comprising a metal having a high melting point or an alloy thereof.

9. The active matrix display device according to claim 3, the protective film comprising a metal having a high melting point or an alloy thereof.

10. The active matrix display device according to claim 1, the protective film comprising an aluminum film of any of a pure aluminum film, an aluminum film containing silicon, and an aluminum film containing copper.

11. The active matrix display device according to claim 3, the protective film comprising an aluminum film of any of a pure aluminum film, an aluminum film containing silicon, and an aluminum film containing copper.

12. The active matrix display device according to claim 1, the protective film having a double-layer structure consisting of a conductive film and an insulating film.

13. The active matrix display device according to claim 3, the protective film having a double-layer structure consisting of a conductive film and an insulating film.

14. The active matrix display device according to claim 1, the thin film transistor in each pixel being a first thin film transistor, the conduction control circuit in each pixel further including a second thin film transistor having a gate electrode thereof connected to a data line via the first thin film transistor, and the second thin film transistor in each pixel and the thin film luminescent element being connected in series between a common feeder line for supplying drive current that is configured separately from the data line and the scanning line, and the opposing electrode.

15. An active matrix display device comprising:
    a thin luminescent element comprising a pixel electrode, a luminescent thin film and an opposing electrode, the opposing electrode being in commmon with a plurality of the pixel electrodes; and
    a protective film disposed on at least a region where the opposing electrode is formed.

16. The active matrix display device according to claim 15, further comprising an insulating film defining an area of the luminescent thin film.

17. The active matrix display device according to claim 15, further comprising an insulating film defining a pixel.

* * * * *